United States Patent
Popoli (10) Patent No.: US 9,203,536 B2
(45) Date of Patent: Dec. 1, 2015

(54) FREQUENCY DRIFT ESTIMATION FOR LOW COST OUTDOOR UNIT FREQUENCY CONVERSIONS AND SYSTEM DIAGNOSTICS

(71) Applicant: The DIRECTV Group, Inc., El Segundo, CA (US)

(72) Inventor: Robert F. Popoli, Rancho Palos Verdes, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 180 days.

(21) Appl. No.: 13/964,940

(22) Filed: Aug. 12, 2013

(65) Prior Publication Data

US 2013/0331025 A1    Dec. 12, 2013

Related U.S. Application Data

(63) Continuation of application No. 13/554,022, filed on Jul. 20, 2012, now Pat. No. 8,509,722, which is a continuation of application No. 12/683,270, filed on Jan. 6, 2010, now Pat. No. 8,229,383.

(60) Provisional application No. 61/142,865, filed on Jan. 6, 2009.

(51) Int. Cl.
*H04H 20/74* (2008.01)
*H04H 40/90* (2008.01)
*H03J 7/04* (2006.01)

(52) U.S. Cl.
CPC . *H04H 40/90* (2013.01); *H03J 7/04* (2013.01)

(58) Field of Classification Search
CPC ..................................................... H04H 40/90
USPC .............. 455/3.02, 255, 232.1, 75, 77, 234.1; 375/340, 327, 354
See application file for complete search history.

(56) References Cited

U.S. PATENT DOCUMENTS

2009/0088082 A1*  4/2009  Sigmund ..................... 455/67.11

* cited by examiner

*Primary Examiner* — Sanh Phu (57) ABSTRACT

A method and apparatus receiving wireless signals and generating an output signal and diagnostic information therefrom is disclosed. Each of the plurality of wireless signals comprises video information and is characterized by a wireless frequency band, polarization, and apparent spatial direction, and the output signal comprises the video information of any the plurality of wireless signals, frequency translated to one of a plurality of stacked output signal frequency bands.

20 Claims, 8 Drawing Sheets

FREQUENCY DRIFT ESTIMATION FOR LOW COST OUTDOOR UNIT FREQUENCY CONVERSIONS AND SYSTEM DIAGNOSTICS

CROSS-REFERENCE TO RELATED APPLICATIONS

This application is related to U.S. application Ser. No. 12/195,256, filed on Aug. 20, 2008, by Robert F. Popoli, entitled "COMPUTATIONALLY EFFICIENT DESIGN FOR BROADCAST SATELLITE SINGLE WIRE AND/OR DIRECT DEMOD INTERFACE," which application is incorporated by reference herein.

This application is a continuation of U.S. application Ser. No. 13/554,022, filed on Jul. 20, 2012, which is a continuation of U.S. application Ser. No. 12/683,270, filed on Jan. 6, 2010, now U.S. Pat. No. 8,229,383, which claims the benefit under 35 U.S.C. Section 119(e) of U.S. Provisional Application Ser. No. 61/142,865, filed on Jan. 6, 2009, by Robert F. Popoli, entitled "FREQUENCY DRIFT ESTIMATION FOR LOW COST OUTDOOR UNIT FREQUENCY CONVERSIONS AND SYSTEM DIAGNOSTICS," which applications are incorporated by reference herein.

BACKGROUND OF THE INVENTION

1. Field of the Invention

The present invention relates generally to satellite video systems, and in particular, to a method, apparatus, and article of manufacture for frequency drift estimation in satellite outdoor unit systems.

2. Description of the Related Art

Satellite broadcasting of communications signals has become commonplace. Satellite distribution of commercial signals for use in television programming currently utilizes multiple feedhorns on a single Outdoor Unit (ODU) which supply signals to up to eight Integrated Receiver/Decoders (IRDs), e.g., set top boxes, on separate cables from a multiswitch.

Figure 1:
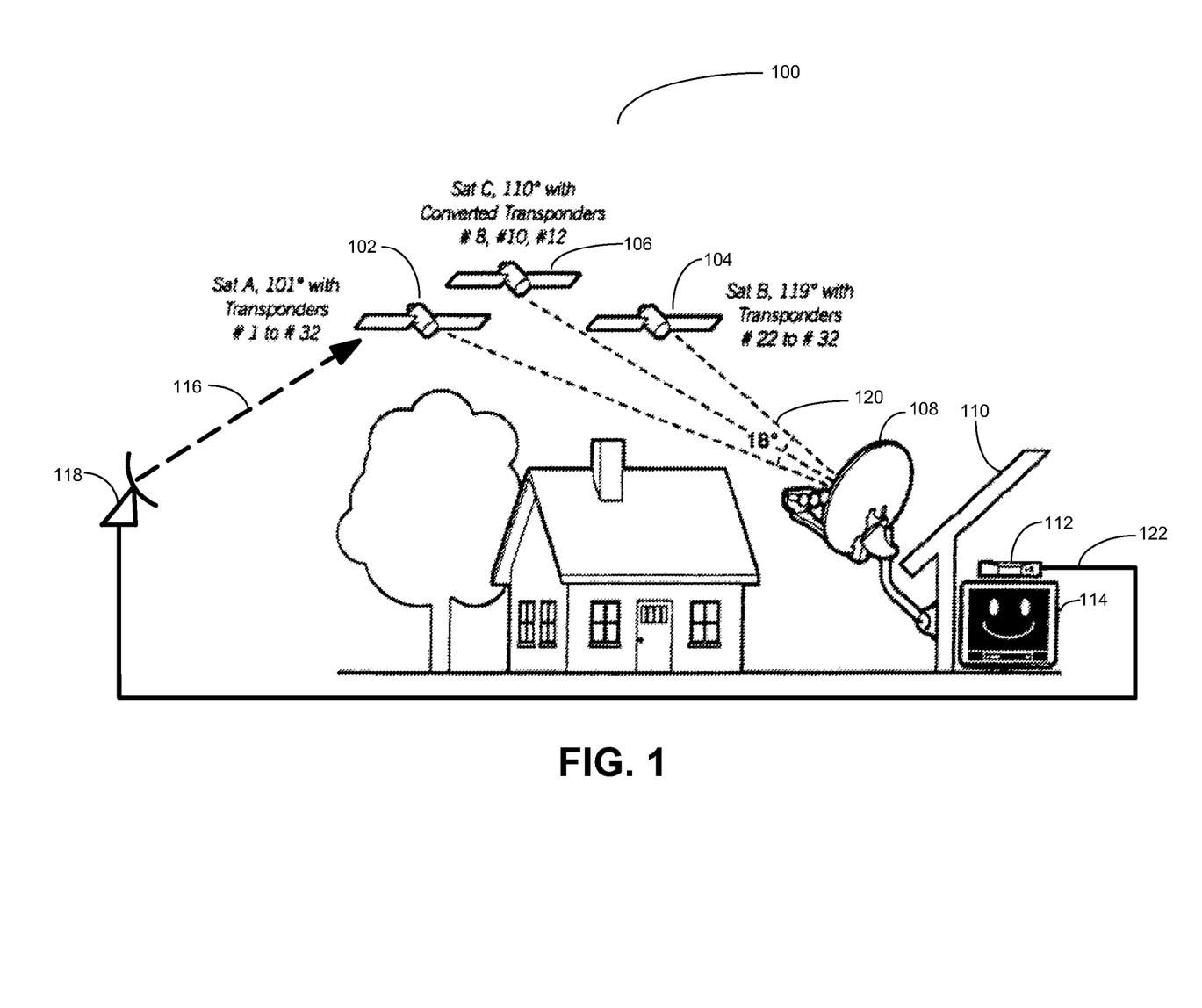
FIG. 1 illustrates a typical satellite-based broadcast system of the related art.

FIG. 1 illustrates a typical satellite-based broadcast system of the related art.

System 100 uses signals sent from Satellite A (SatA) 102, Satellite B (SatB) 104, and Satellite C (SatC) 106 that are directly broadcast to an Outdoor Unit (ODU) 108 that is typically attached to the outside of a house 110. ODU 108 receives these signals and sends the received signals to IRD 112, which decodes the signals and separates the signals into viewer channels, which are then passed to monitor 114 for viewing by a user. There can be more than one satellite transmitting from each orbital location (slot). The orbital slots are typically designated by their longitude, so, for example, a satellite 102 located in the orbital slot at 101 degrees West Longitude (WL) is usually referred to as transmitting from "101."

Satellite uplink signals 116 are transmitted by one or more uplink facilities 118 to the satellites 102-106 that are typically in geosynchronous orbit. Satellites 102-106 amplify and rebroadcast the uplink signals 116, through transponders located on the satellite, as downlink signals 120. Depending on the satellite 102-106 antenna pattern, the downlink signals 120 are directed towards geographic areas for reception by the ODU 108.

Each satellite 102-106 broadcasts downlink signals 120 in typically thirty-two (32) different frequencies, which are licensed to various users for broadcasting of programming, which can be audio, video, or data signals, or any combination. These signals are typically located in the Ku-band of frequencies, i.e., 11-18 GHz, but can also be broadcast in the Ka-band of frequencies, i.e., 18-40 GHz, but typically 20-30 GHz.

Within ODU 108, the downlink signals 120 are downconverted to lower frequencies using an oscillator and a mixer. Typically, the oscillator is a Dielectric Resonant Oscillator (DRO). If the DRO frequency drifts, the downconversion of the downlink signals 120 drifts as well, which makes processing of such downconverted signals more difficult.

Further, as satellites 102-106 broadcast additional services and additional channels to viewers, as well as additional satellite signals present in such bandwidths, it will be more efficient to monitor and, if necessary, correct drifts in the DRO frequency.

SUMMARY OF THE INVENTION

To minimize the limitations in the prior art, and to minimize other limitations that will become apparent upon reading and understanding the present specification, systems and devices for controlling frequency drift in satellite broadcast systems are presented herein.

A receiver antenna system for a direct broadcast satellite signal communications system in accordance with one or more embodiments of the present invention comprises an oscillator, a mixer, coupled to the oscillator, for converting satellite signals at a first frequency to signals at an intermediate frequency, an analog-to-digital (A/D) converter, coupled to the mixer, for receiving the signals at the intermediate frequency and for converting the signals at the intermediate frequency at near-real-time to a digital data stream, a Digital Signal Processor (DSP), coupled to the A/D converter, for processing the digital data stream, and a drift estimator, coupled to the DSP, the drift estimator determining a frequency drift of the oscillator, wherein the receiver antenna system corrects the frequency drift of the oscillator using the determined frequency drift.

Such a system further optionally comprises the drift estimator driving a digital mixer within the DSP to compensate for the determined frequency drift, an output of the drift estimator being fed back to the oscillator to control the frequency drift of the oscillator, an automatic gain control coupled between the mixer and the A/D converter, the A/D converter sampling the signals at the intermediate frequency at a speed greater than 1 gigasample per second, the satellite signals being transmitted in at least the Ku-band of frequencies, the satellite signals being further transmitted in at least the Ka-band of frequencies, a Digital-to Analog Converter (DAC), coupled to the DSP, and an output of the DAC being mixed with a second oscillator, such that an output of the receiver antenna system is set to a desired band on a single wire interface.

A system for distributing a plurality of satellite signals on a single interface in accordance with one or more embodiments of the present invention comprises an oscillator for down-converting the plurality of satellite signals to signals at an intermediate frequency, an Automatic Gain Controller (AGC) for gain controlling the signals at the intermediate frequency, an analog-to-digital (A/D) converter, coupled to the AGC, for receiving the signals at the intermediate frequency, wherein the A/D converter directly samples the signals at the intermediate frequency, and a Digital Signal Processor (DSP), coupled to the A/D converter, wherein a first output of the DSP is used to determine the intermediate frequency and a second output of the DSP is an input to the single interface.

Such a system further optionally comprises a Digital-to-Analog Converter (DAC), coupled to the second output of the DSP, the first output of the DSP determining the intermediate frequency by controlling a frequency of the oscillator, the first output of the DSP driving a compensatory frequency shift by controlling a digital mixer internal to the DSP, the oscillator being a Dielectric Resonance Oscillator (DRO), the plurality of satellite signals being transmitted in a plurality of frequency bands, the plurality of frequency bands comprising a Ka-band and a Ku-band, the DRO down-converting the Ka-band to at least a first intermediate frequency band and the DRO down-converting the Ku-band to a second intermediate frequency band as convenient for A/D conversion, the A/D converter sampling the signals at the intermediate frequency at a rate greater than the Nyquist rate for the signals at the intermediate frequency, state information from at least one of the AGC, the ADC, the DSP, and the DAC providing a diagnostic output for the system, and the diagnostic output comprising at least one of fault recognition, fault reporting, performance monitoring, installation aiding, and installation verification for the system.

Other features and advantages are inherent in the system disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof, and in which are shown, by way of illustration, several embodiments of the present invention. It is understood that other embodiments may be utilized and structural changes may be made without departing from the scope of the present invention.

Overview

Recent advances in high speed Analog to Digital (A/D) converters open up the possibility of direct A/D conversion of baseband or near baseband 500 MHz wide Satellite downlink signals. This allows for all-digital demultiplexing (demuxing) of one or more 500 MHz complexes or transponders and subsequent all-digital multiplexing (muxing) of a selected subset of these transponder channels onto a single wire interface for home distribution. With such a digital implementation, selected transponder baseband I/Q signals may be selected for direct demodulation, for subsequent home or multi-dwelling distribution over any suitable physical/network layer protocols.

By integrating the high-speed A/D hardware with computationally-efficient Digital Signal Processing (DSP) techniques, and adapting them specifically for the purposes of demuxing, muxing, and baseband I/Q conversion, one or more embodiments of the present invention provide significant commercial advantages over current analog designs. Further, simple brute force digital mimicry of known analog building blocks for demuxing/muxing/conversion processes are expected to lead to less commercially-viable designs.

No known previously proposed satellite home/MDU distribution design exists to create a practical all digital implementation of the demuxing, muxing, and direct digital demodulation (demod) interface. This specification proposes a number of embodiments of such designs which utilize computationally efficient techniques which allow for commercially viable all digital implementation of these functions.

The present invention allows for better overall performance of an embodiment of a Single Wire Multiswitch (SWM) architecture because the present invention allows for the distribution of more channels within the same bandwidth (i.e., single wire bandwidth) through tighter packing of channels. Distribution of additional channels allows for the support of additional IRDs, or the same number of IRDs with less wired bandwidth. Further, embodiments of the present invention allow for inexpensive provision of baseband I/Q signals for reduced cost integration of a significant portion of the current IRD. Further still, embodiments of the present invention allow for the ability to provide greater flexibility for future system designs, and the potential of a smaller footprint for the SWM into the current system. Embodiments of the present invention also allow for simpler integration and interfaces between the parts of the present system, by simplifying the interface of shared demodulation resources without expending any bandwidth. This simplification allows for future products, such as Home Gateway and Multi-Dwelling Unit (MDU) architectures, to become possible.

Digital SWM (DSWM)

Figure 2:
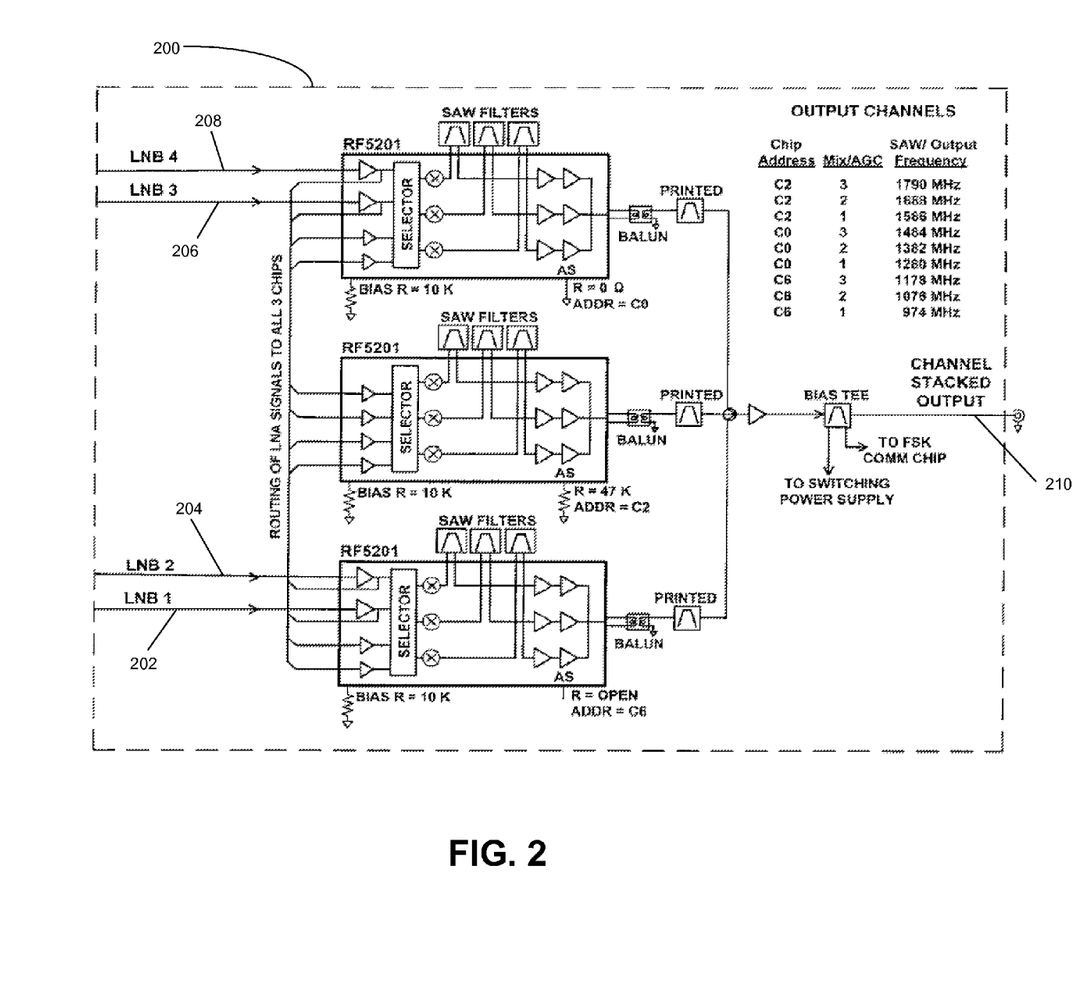
FIG. 2 illustrates a typical Single Wire Multiswitch (SWM) of the related art.

FIG. 2 illustrates a typical Analog Single Wire Multiswitch.

Hardware advances have increased A/D sampling rates in excess of 1 Gigasample/second (1 GSPS) with a good Effective Number Of Bits (ENOB) and an adequate linearity performance figure. Advances in multi-rate Digital Signal Processing techniques coupled with nanometer Application-Specific Integrated Circuit (ASIC) processes allow applications with significant signal processing capabilities. These factors make it possible to make an all-digital replacement for the demux and mux functions of the Single Wire Multiswitch (SWM). Further, these technological advances allow for a baseband and/or near baseband digital I/Q interface for cost-effective integration of a significant portion of the IRD front end functionality.

One or more embodiments of the present invention provide a digital replacement for the hardware shown in FIG. 2. FIG. 2 illustrates SWM 200, where SWM 200 is fed by four composite signals 202-208, specifically LNB1 202, LNB2 204, LNB3 206, and LNB4 208, which are produced by the LNB module 300 hardware shown in FIG. 3A.

Figure 3A:
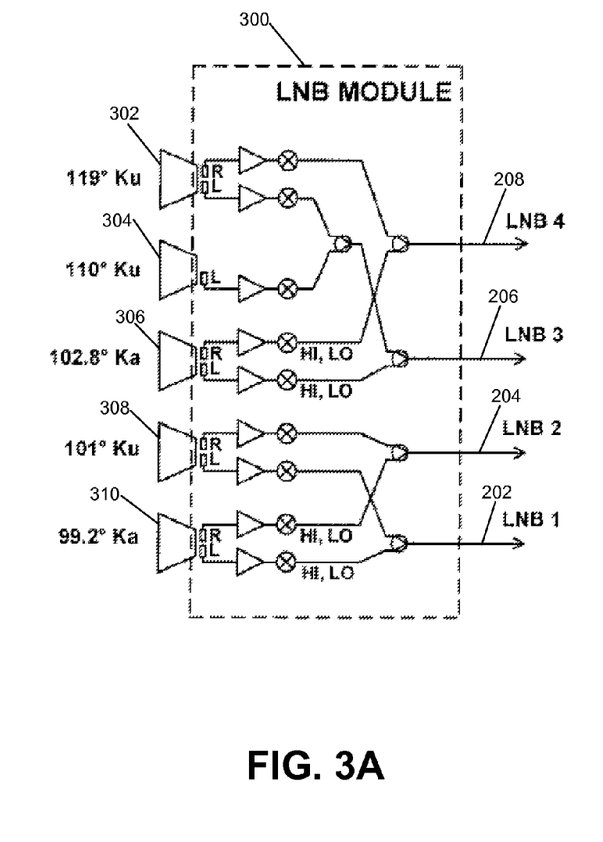
FIGS. 3A and 3B illustrate related LNB modules and an LNB module in accordance with one or more embodiments of the present invention, respectively.

Each LNB signal 202-208, as shown in FIG. 3A, comprises multiple (e.g., three) stacked 500 MHz bandwidth signals, generated from downlink signals 120 and received at various orbital slots. Ku-band signals 302 are from satellites at the 119 WL slot, Ku-band signals 304 are from satellites at the 110 WL slot, Ka-band signals 306 are from satellites at the 102.8 (also referred to as 103) WL slot, Ku-band signals 308 are from satellites at the 101 WL slot, and Ka-band signals 302 are from satellites at the 99.2 (also referred to as 99) WL slot. Combinations of these signals, based on their polarization and transmission frequencies, are used to generate LNB signals 202-208.

After down-conversion within module 300, the Ku-band signals 302, 304, and 308 are down-converted to an Intermediate Frequency (IF) band, 500 MHz wide, in the frequency range of 950-1450 MHz. The Ka-band signals 306 and 310 are down-converted into two different 500 MHz wide bandwidths, namely the 250-750 MHz bandwidth (known as Ka-LO IF band or Ka-B IF band) and the 1650-2150 MHz bandwidth (known as Ka-HI IF band or Ka-A IF band), and are combined in various combinations to form signals 202-208

The SWM 200 shown in FIG. 2 selects any nine 40 MHz pieces of spectrum from LNB1 202 through LNB4 208 and stacks them to form a single composite signal called the channel stacked output 210. The nine 40 MHz channels are typically located on 102 MHz centers and range from 974 MHz to 1790 MHz (i.e., the channels are at 974, 1076, 1178, 1280, 1382, 1484, 1586, 1688, and 1790 MHz, respectively).

Coarse Granularity Design

Figure 3B:
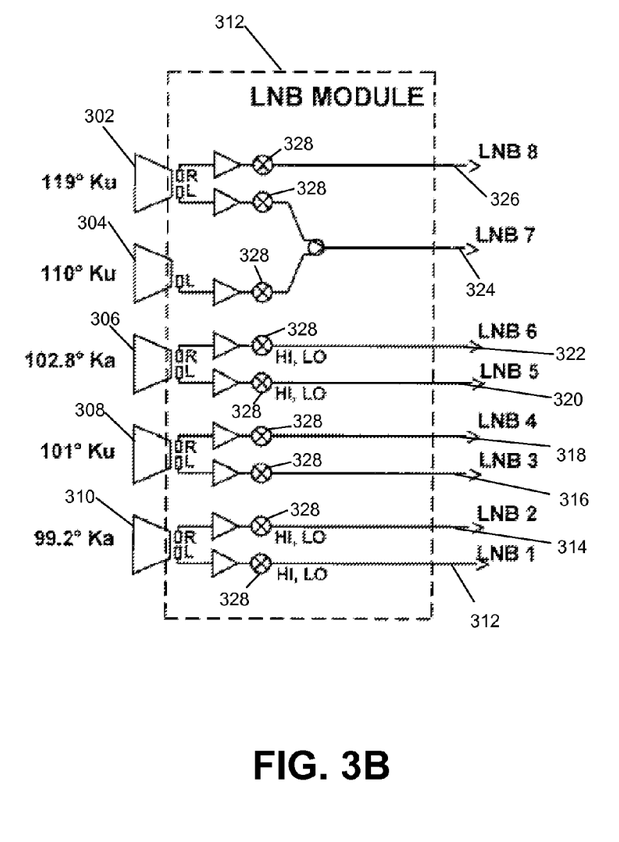

FIG. 3B illustrates an embodiment an LNB structure corresponding to a Digital SWM Design in accordance with the present invention.

The SWM module 300 is modified into module 312, where signals 302-310 are combined into different signals that are to be used as inputs to a modified SWM. Rather than stacking 1500 MHz into a single signal, as is done with signals 202-208, a larger number of outputs 312-326 are used. Although eight outputs 312-326 are shown, a larger or smaller number of outputs 312-326 are possible without departing from the scope of the present invention.

As shown in FIG. 3B, LNB1 signal 312, LNB2 signal 314, LNB5 signal 320, and LNB6 signal 322 each comprise two 500 MHz signals, each 500 MHz signal corresponding to a Ka-LO band signal and a Ka-HI band signal. This arrangement is appropriate if the A/D has enough front end bandwidth to subsample the Ka-Hi band in its $2^{nd}$ Nyquist Band. Alternatively, separate independent IF conversion for the Ka-Lo and Ka-Hi can be provided for more traditional $1^{st}$ Nyquist band sampling of each signal. LNB3 signal 316, LNB4 signal 318, LNB7 signal 324, and LNB8 signal 326, on the other hand, are 500 MHz signals, each corresponding to a Ku-band signal. To facilitate A/D conversion, the local oscillators 328 can be modified so that each of the signals 312-326 can have a desired and, possibly, different tunable starting frequency from 10 to 100 MHz, or beyond these limits if desired. Additional mixing can be added to achieve an offset frequency start for one or more of the signals 312-326 if desired. It is also possible within the scope of the present invention to implement tuning for signals 312-326 within the digital domain if desired.

Figure 4:
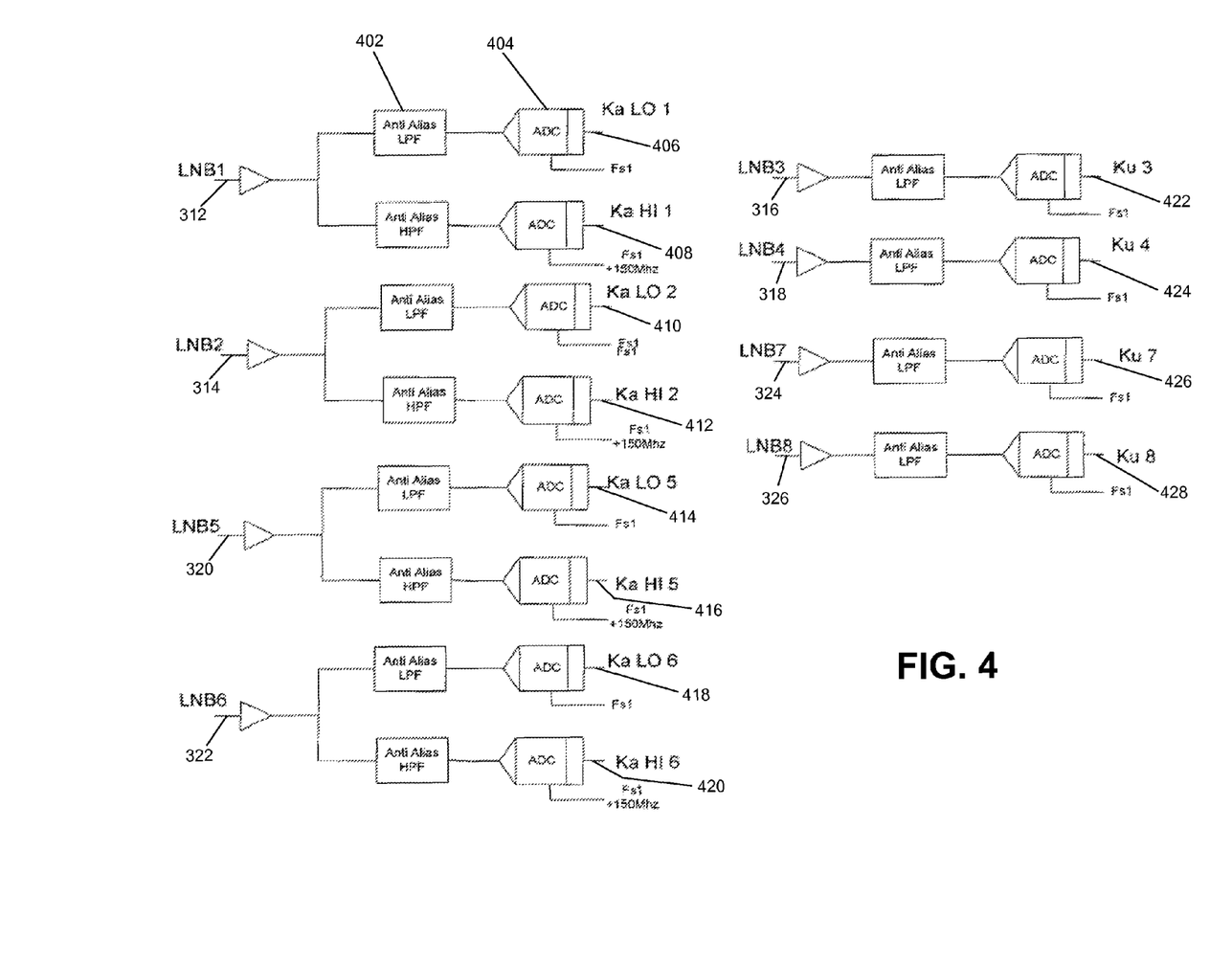
FIG. 4 illustrates an Analog-to-Digital subsystem functionality in accordance with one or more embodiments of the present invention.

FIG. 4 illustrates an embodiment of the Analog-to-Digital subsystem functionality of the present invention.

FIG. 4 shows the A/D subsystem 400 functions, where the sampling frequency Fs is adjustable, typically from 1.02 GHz to 1.2 GHz, but other frequencies and ranges are possible within the scope of the present invention. Each signal 312-326 is placed through a filter 402, and then into an A/D converter 404, which produce the output signals 406-428. The typical maximal sampling rate of the A/D converters 404, FsMAX, is typically 1.35 GHz, but other rates are possible without departing from the scope of the present invention. The Ka HI signals are typically sub-sampled, so the analog paths should have a useable bandwidth of FsMAX+500 MHz, which is typically 1.85 GHz. Alternatively if separate IF conversion is provided for the Ka-Hi signal then traditional $1^{st}$ Nyquist band sampling and Lo-Pass anti-alias filters would be employed.

Figure 5:
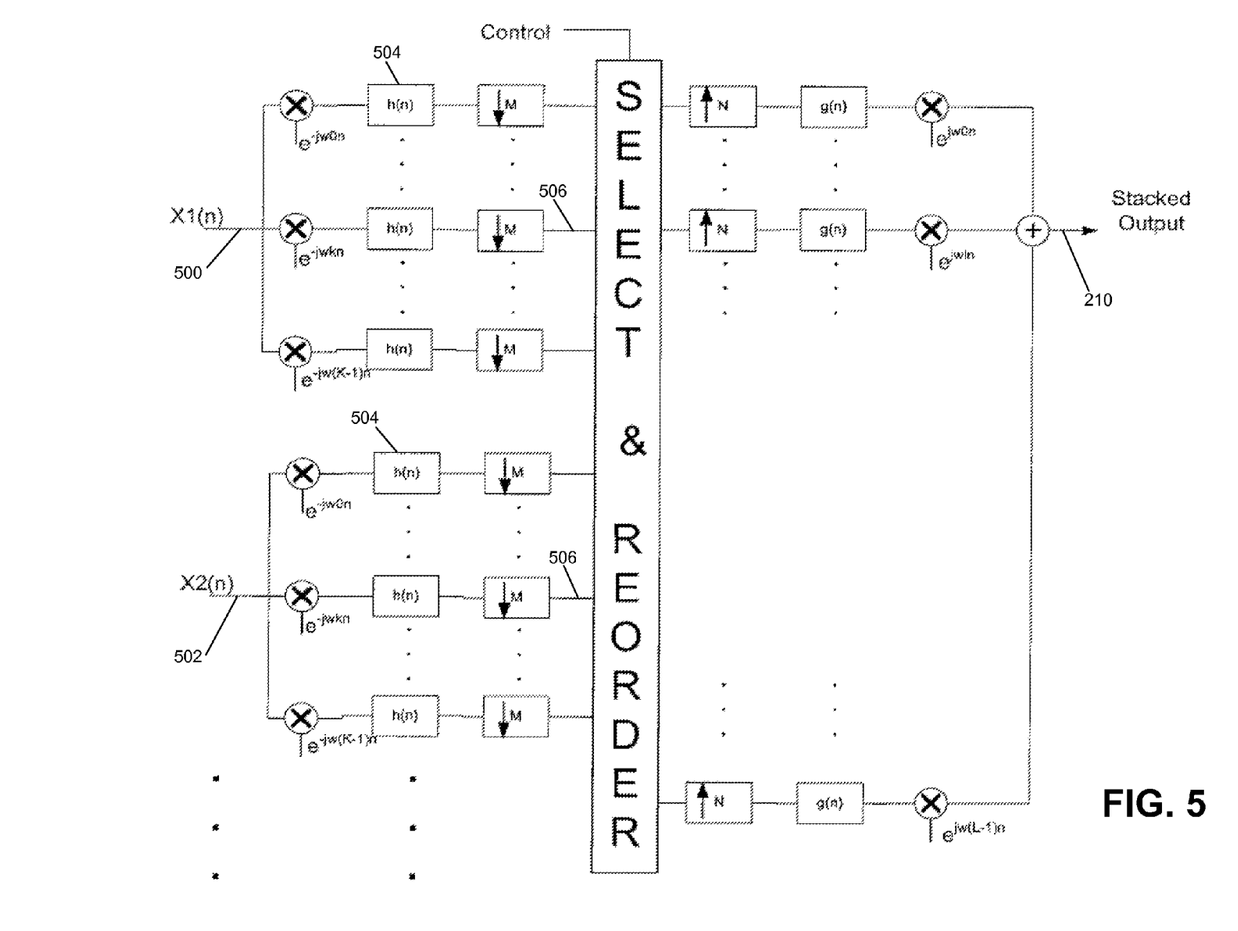
FIG. 5 illustrates a block diagram of the Digital Single Wire Multiswitch (DSWM) Channelizer in accordance with one or more embodiments of the present invention.

FIG. 5 illustrates a block diagram of the DSWM Channelizer in accordance with one or more embodiments of the present invention.

Each input "x" 500, 502, etc., receives one of the A/D converter 404 outputs 406-428, and there can be extra inputs x 500, 502, etc., to allow for expansion of the system. Each typical input x 500 is typically channelized into uniformly spaced K filters 504. The portion k 506 of the K filters 504 actually utilized may be different for different LNB paths, and, typically, k=12 for Ka HI, k=12 for Ka LO, and k=16 for Ku. L, the number of filter bands on the output side, is set to be equal to the number of stacked carriers desired at the stacked output 210.

There are many embodiments within the scope of the present invention that can create computationally efficient DSP architectures. Another example embodiment of the present invention uses multi-rate poly phase techniques and takes advantage of the correspondence between the complex mixing and the Fast Fourier Transform (FFT), as shown in FIG. 6.

Figure 6:
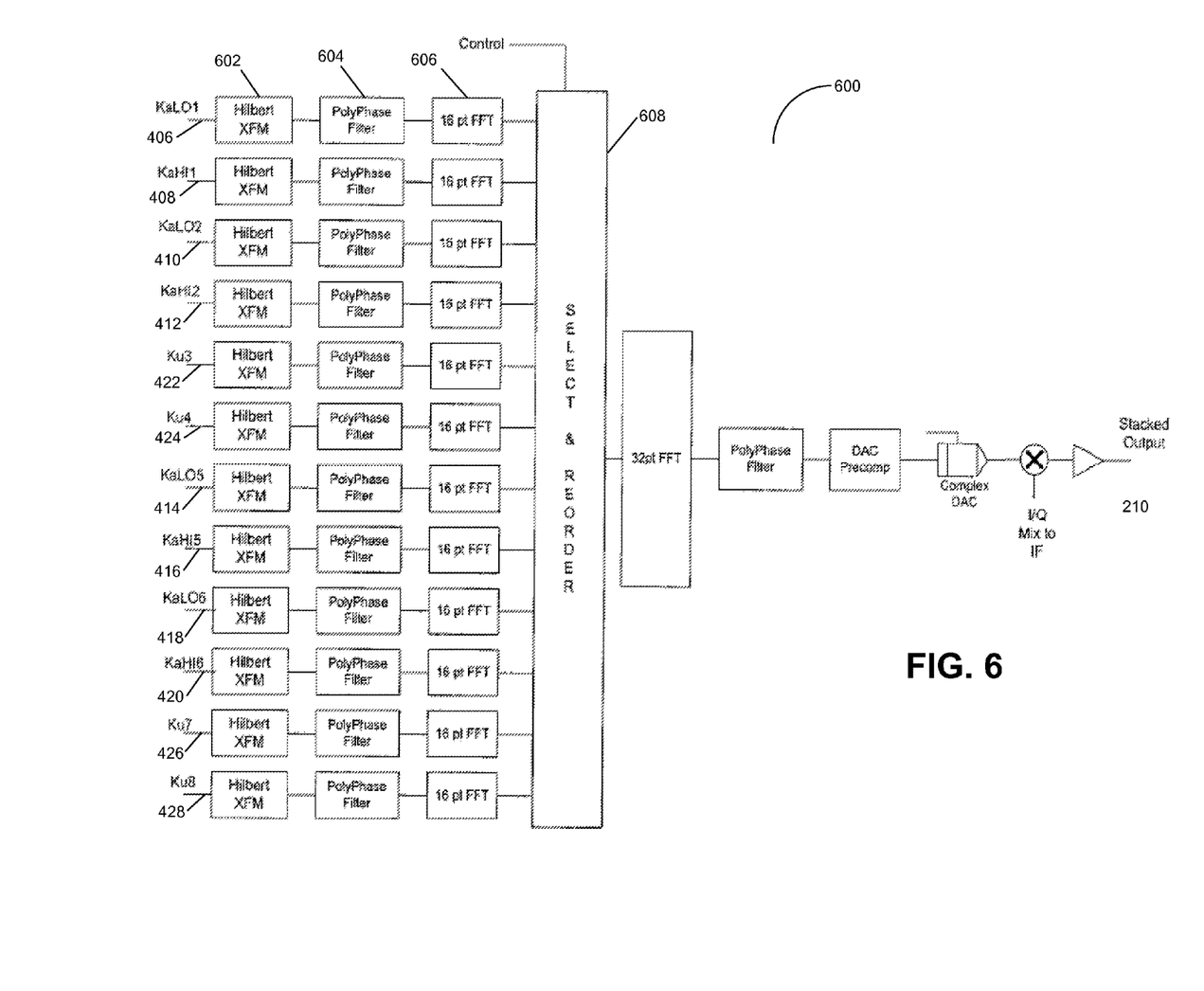
FIG. 6 illustrates a coarse granularity channelizer in accordance with one or more embodiments of the present invention.

FIG. 6 illustrates a coarse granularity channelizer in accordance with one or more embodiments of the present invention.

In FIG. 6, system 600 shows inputs 406-428, each entering a Real to Complex Hilbert transformer 600. Other types of Real to Complex transforms of the signal inputs 406-428 are also possible within the scope of the present invention. The K filters 604 for each of the inputs 406-428 are set to 16, but other settings are possible within the scope of the present invention, including different values for K and x for each input 406-428. If the transponder count and spacing are uniform and well known, then K can be set to the number of transponders, etc. If, however, the number of transponders varies from satellite to satellite and/or the spacing of these transponders is not uniform, then a number of filters 604 greater than the maximum number of transponders to be encountered is typically used to allow for expansion. Further, the filters are then expanded or contracted by slight adjustments in the sampling frequency and by slight shifts in the down-converter LO frequency used in the LNB. By adjustment of both the down-converter LO of the LNB and sampling rate, any channel spacings can be accommodated in any of the LNB outputs.

The signals 406-428, after being filtered by filters 602 are subjected to Fast Fourier Transforms (FFT) in FFTs 606, and then selected, reordered, and combined in multiplexer 608. The combined signal is further processed to generate stacked output 210. Alternatively, the present invention can use a non-maximally decimated filter bank of overlapping filters. This approach, along with the added technique of near-perfect reconstruction techniques simplify the fine granularity design.

A choice of L=32 and K=16 are illustrative only. The choice of the power of 2 composite K and L is chosen to simplify the FFT hardware implementation. Other approaches or arrangements may also be used within the scope of the present invention.

ADC ENOB Considerations

Consider any one of the 500 MHz LNB signals 406-428. Since each signal is a composite of many signals, each signal is approximately Gaussian distributed. Given this approximation, the attack point on the ADC can be set low enough so that probability of the input exceeding the full scale deflection is controlled and thereby minimize the clipping noise effects. Similarly the attack point can be set high enough so that the ADC is driven hard enough to minimize the effects of quantization noise. The balancing of these two noise affects yields an optimal attack point (sometimes referred to as backoff point). For any given backoff point then the ADC Effective Number of Bits (ENOB) will determine the Signal to Quantization Noise Floor. For anticipated transponder loadings an ENOB of 8 bits is more than sufficient. Since A/D are available at approximately this ENOB while operating well in excess of 1 Gsps, the current state of the art in ADCs is sufficient to implement the designs described by this invention. However, an accounting of the Noise-Power Ratio of the finite word processing and additional details of the noise bandwidth and system settings may allow the ENOB to be relaxed from a 8 bit setting and still be within the scope of the present invention.

Fine Granularity Design

Figure 7:
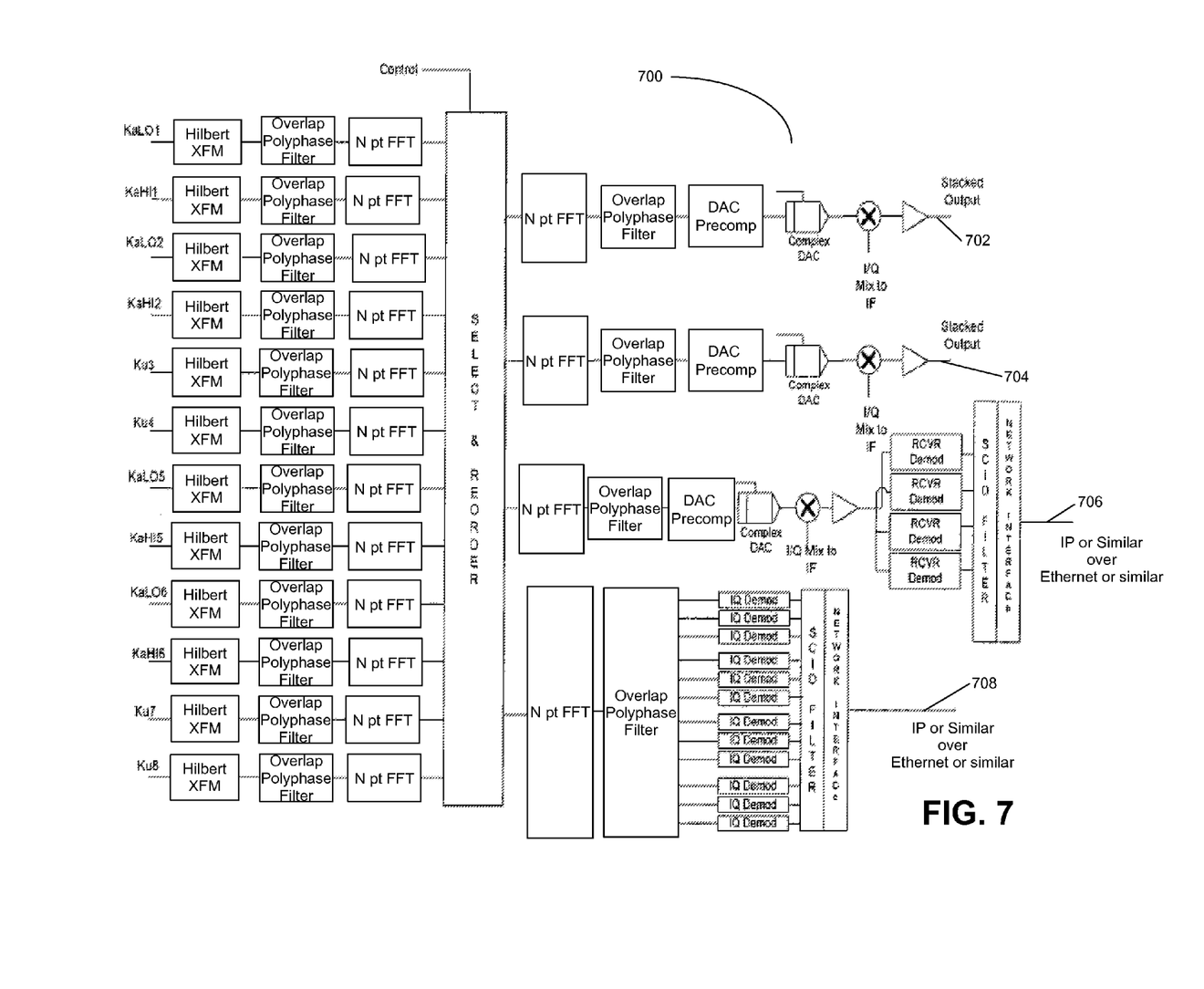
FIG. 7 illustrates an exemplary fine granularity channelizer embodiment in accordance with one or more embodiments of the present invention.

FIG. 7 illustrates a fine granularity channelizer implementation in accordance with one or more embodiments of the present invention.

A fine granularity design using perfect or near perfect reconstruction polyphase filtering techniques has advantages over the coarse granularity approach. For such an approach, the spectrum of each of the incoming 500 MHz blocks is subdivided much more finely than in the coarse granularity design. Where in the coarse granularity design the goal is to create a number of filters greater than or equal to the maximum number of expected transponders, in the fine granularity design the goal is to divide up the spectrum into smaller pieces. This can be done in such a way that the fine pieces of spectrum can be "glued" back together to yield a nearly perfect reconstruction of any arbitrary spectral bandwidth within the granularity specified for the design. Employment of non-maximal decimation techniques can be used to simplify filter design if desired. An illustrative design for a fine granularity system is shown in FIG. 7.

The system 700 shown in FIG. 7 has four output signals 702, 704, 706, and 708. Outputs 702 and 704 are typically used to create two 500 MHz blocks of single wire bandwidth. Outputs 702 and 704 can then be power combined onto a single wire interface and thus replicate the output of related SWM designs, except that they provide more channels within the same physical bandwidth.

The other outputs 706 and 708 depicts two illustrative embodiments that include shared demod assets that do not expend any of the Single Wire Bandwidth. Other embodiments are possible within the scope of the present invention. Optionally, only one output 706 or 708 can be implemented, or other embodiments can be implemented alone or in any combination, without departing from the scope of the present invention. Output 706 illustrates an approach having an additional internal single wire interface which drives conventional receiver/demod inputs.

Output 708 illustrates an approach where the receiver portion of the receiver demod chips can be eliminated at the same time as the last up-conversion of the processed signals.

These chips correspond to I/Q near baseband demodulation. Other configurations are possible if some of the output polyphase filtering is incorporated directly on the demod chip for individual true baseband I/Q processing. In both outputs 706 and 708, the output of the shared demod resources is Satellite Communicator Identification Code (SCID) filtered data which is networked onto any suitable physical layer and/or network layer protocols for distribution throughout the house or Multiple Dwelling Unit (MDU). The outputs 706 and 708 are Internet Protocol (IP) type outputs, or similar, that can be output over ethernet cabling, local area networks, RF, or other similar interfaces as desired, without departing from the scope of the present invention.

DRO Frequency Drift Control

Figure 8:
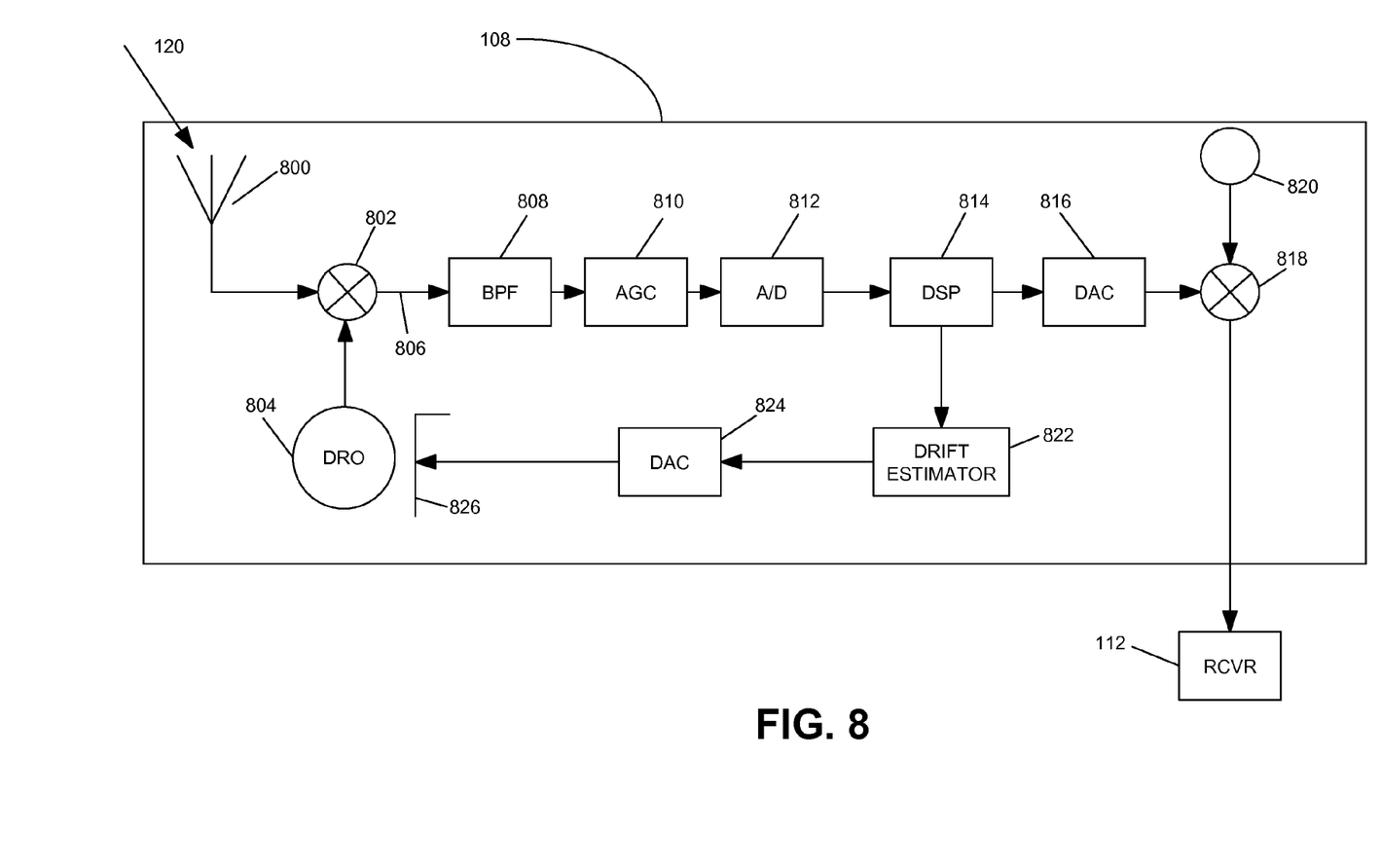
FIG. 8 illustrates a block diagram of a frequency drift control system in accordance with one or more embodiments of the present invention.

FIG. 8 illustrates a functional block diagram of processing of one 500 MHz band in accordance with one or more embodiments of the present invention.

Advances in Digital Signal Processing (DSP) techniques, specifically, the speed at which DSP techniques can now take place, allow for more efficient bandwidth packing of signals on a single wire interface between ODU 108 and receiver 112. However, in order to take advantage of this tighter signal packing, the frequency stability of frequency sources, in this case, the frequency source used to initially down-convert signals 120 into an intermediate frequency must be similarly improved. The present invention allows for estimation of frequency drift of the frequency source used for down-conversion, as well as allowing for the ability to measure frequency domain errors which will allow for diagnostic feedback on the state of system 100.

As shown in FIG. 8, signals 120 are received at ODU 108, and then are passed on to receiver 112. Within ODU 108, an antenna 800 receives the signals 120 at both Ku-band and Ka-band (e.g., approximately 20 GHz), which are mixed at mixer 802 with the output of DRO 804. This mixing process results in an output of mixer 802 of the sum and difference frequencies of signals 120 and DRO 804, and the frequency of DRO 804 is chosen to down-convert signals 120 to a frequency convenient for A/D conversion.

These signals are then typically filtered through a Band Pass Filter (BPF) 808 to remove harmonics and other unwanted signals, and then typically passed to Automatic Gain Control (AGC) 810 circuitry to normalize the signals 806 to a common signal strength. Such a common strength is typically desirable to properly excite Analog-to-Digital (A/D) converter 812 to set the attack point as previously described in the ENOB Considerations discussion.

A/D 812 is a high-speed A/D converter, in that it can run at 1 Gigasample per second (GSPS) or higher. Such speed is needed because the typical bandwidth of the signals 806 is 500 MHz, and to sample at the minimum Nyquist rate for such signals requires a minimum of twice the bandwidth, or 1 GSPS. A/D 812, thanks to recent advances in A/D design, can now achieve 1 GSPS rates, and higher. Once digitized by A/D 812, Digital Signal Processor (DSP) 814 processes the signals and converts them back to analog signals in the Digital-to-Analog Converter (DAC) 816. Such signals are then mixed at mixer 818 with a local oscillator 820 and forwarded on to receiver 112. Optionally, this last mixer can be avoided if a DAC with sufficient BW is employed such that it can directly cover the desired single wire interface band.

Within DSP 814, the signals can be sent to a drift estimator 822, where drift of the frequency of signals 806 can be sensed. Sensing drifts from various sources are achievable within the scope of the present invention, e.g., drifts which affect single carriers within a given bandwidth of signals or drifts which affect an aggregate of carriers, etc., however, the primary cause of drift of signals 806 is the DRO 804 frequency drift with temperature and age. DRO 804 is located at the dish antenna 800 of ODU 108, and as the sun heats the dish antenna 800, DRO 804 warms up which causes drift, and as the sun goes down dish antenna 800 cools down, cooling down DRO 804, again causing drift in frequency. Further, aging of the DRO 804 will also cause a frequency drift in the DRO 804 output.

The drift estimator 822 can be of several varieties. One solution that can be used for drift estimator 822 is to create a discriminator based on a matched filter design, such that the expected type and distribution of transponders within the aggregate bandwidth of signals 806 is sensed. Such a discriminator can be developed for individual transponders if desired, or the edges of the bandwidth can be sensed. For transponders with symmetrical properties, the discriminator can be a matched filter with a sign reversal about the center frequency, however, if the purpose is to drive the average drift of the DRO 804 to zero, a matched filter for all of the transponders within the aggregate bandwidth can be utilized. Although the drift estimator algorithm may result in a biased estimate of each transponder's frequency that is down-converted by the DRO 804, the DRO 804 is tuned by the aggregate of the transponder drift discriminants (biased or not) and will therefore tend to average out the biasing effects due to any individual transponder gain slopes and ripples.

The present invention also allows for system 100, via ODU 108 (also called a Single-Wire Multiswitch ODU or SWM-ODU) to recognize large frequency deviations and frequency trends over the life of ODU 108. As DRO 804 frequencies drift over the life of DRO 804, the present invention can provide not only feedback to DRO 804, but to system providers via receiver 112 callbacks or other communications between receiver 112 and system providers. Receivers 112 typically comprise a high-speed internet or other interface to allow communications between the system provider and individual receivers 112; reporting system 100 health issues can now, through the use of the present invention, be undertaken by processors in receiver 112 and/or DSP 814.

The outputs of drift estimator 822 are then converted to analog voltages in DAC 824, and then fed back to DRO 804 via a control input 826 to DRO 804. In essence, DRO 804 acts like a Voltage Controlled Oscillator (VCO) at this point, where the voltage applied at 826 controls the frequency output of DRO 804.

Although the use of DSP outputs to sense and correct frequency drift faults is emphasized herein, other uses of DSP 814 outputs to recognize other faults and to take other corrective actions are possible within the scope of the present invention. In particular, by virtue of the architecture of the described processing key diagnostic information is available for other diagnostics. A mixed signal ASIC will typically include the AGCs 810, ADCs 812, DSP 814, DACs 816, and a general purpose processor implementing the Drift Estimator 822 matched filter discriminant. Thus the general purpose processor has access to information regarding the state of each of these subsystems. Beyond determining the frequency drift, the matched filter results coupled with knowledge of the AGC states provides important diagnostic information if no match is found over the possible range of drift frequencies of a given expected transponder. The system can thereby recognize the absence of expected transponders and can report this fault. This fault represents a fault in system 100 to deliver the missing transponder to the ODU 108. The failure of the match filter to find a match for any transponder in a given 500 MHz band indicates the potential failure of one of the 500 MHz signal paths 312, 314, 318, 320, 322, 324, and 326 or subsequent processing these signal paths indicating a potential hardware failure in the ODU 108. In particular, if it is known that other ODUs 108 at other sites (homes) in the near vicinity of a given ODU 108 are not reporting faults, then it can be concluded by system 100 that the fault is isolated to the given ODU ("lone ODU"). In contrast, if all ODUs 108 in the vicinity of a given ODU 108 all report faults on many 500 MHz bands over a given short period of time followed by a complete recovery, the likely cause of the event is a weather generated event. In particular, if a collocated group of ODUs report faults occurring primarily or for longer periods of time on the Ka bands as opposed to the Ku bands then a weather event is very likely since weather affects Ka signals much more severely then the Ku signals. If a lone ODU 108 reports failures on many of its signal paths for extended periods of time then ODU 108 mis-pointing is indicated. During installation, the diagnostics described also have value. Analyzing a combination of matched filter and AGC results, information to aid in the initial ODU antenna pointing and verification of the final installation can be provided. The above examples, e.g., the use of state information from at least one of the AGC, the ADC, the DSP, and the DAC providing a diagnostic output for the system, where the diagnostic output comprises at least one of fault recognition, fault reporting, performance monitoring, installation aiding, and installation verification for the system 100, are provided as examples of the class of diagnostics and installation verification aids possible by analysis of data related to the state of the subsystems of the given architecture. Any such diagnostics or installation aids derived from such state information is within the scope of this invention.

Although discussed with respect to voltage control of DRO 804, other methods of control of signals 806, and the effects of DRO 804 drift, can be accomplished with the present invention. For example, and not by way of limitation, a digital compensation within DSP 814 of the frequency offset, once estimated by drift estimator 822, can also be achieved via feedback between drift estimator 822 and DSP 814.

CONCLUSION

The present invention discloses systems and devices for controlling frequency drift in satellite broadcast systems. A receiver antenna system for a direct broadcast satellite signal communications system in accordance with one or more embodiments of the present invention comprises an oscillator, a mixer, coupled to the oscillator, for converting satellite signals at a first frequency to signals at an intermediate frequency, an analog-to-digital (A/D) converter, coupled to the mixer, for receiving the signals at the intermediate frequency and for converting the signals at the intermediate frequency at near-real-time to a digital data stream, a Digital Signal Processor (DSP), coupled to the A/D converter, for processing the digital data stream, and a drift estimator, coupled to the DSP, the drift estimator determining a frequency drift of the oscillator, wherein the receiver antenna system corrects the frequency drift of the oscillator using the determined frequency drift.

Such a system further optionally comprises the drift estimator driving a digital mixer within the DSP to compensate for the determined frequency drift, an output of the drift estimator being fed back to the oscillator to control the frequency drift of the oscillator, an automatic gain control coupled between the mixer and the A/D converter, the A/D converter sampling the signals at the intermediate frequency at a speed greater than 1 gigasample per second, the satellite signals being transmitted in at least the Ku-band of frequencies, the satellite signals being further transmitted in at least the Ka-band of frequencies, a Digital-to Analog Converter (DAC), coupled to the DSP, and an output of the DAC being mixed with a second oscillator, such that an output of the receiver antenna system is set to a desired band on a single wire interface.

A system for distributing a plurality of satellite signals on a single interface in accordance with one or more embodiments of the present invention comprises an oscillator for down-converting the plurality of satellite signals to signals at an intermediate frequency, an Automatic Gain Controller (AGC) for gain controlling the signals at the intermediate frequency, an analog-to-digital (A/D) converter, coupled to the AGC, for receiving the signals at the intermediate frequency, wherein the A/D converter directly samples the signals at the intermediate frequency, and a Digital Signal Processor (DSP), coupled to the A/D converter, wherein a first output of the DSP is used to determine the intermediate frequency and a second output of the DSP is an input to the single interface.

Such a system further optionally comprises a Digital-to-Analog Converter (DAC), coupled to the second output of the DSP, the first output of the DSP determining the intermediate frequency by controlling a frequency of the oscillator, the first output of the DSP driving a compensatory frequency shift by controlling a digital mixer internal to the DSP, the oscillator being a Dielectric Resonance Oscillator (DRO), the plurality of satellite signals being transmitted in a plurality of frequency bands, the plurality of frequency bands comprising a Ka-band and a Ku-band, the DRO down-converting the Ka-band to at least a first intermediate frequency band and the DRO down-converting the Ku-band to a second intermediate frequency band as convenient for A/D conversion, the A/D converter sampling the signals at the intermediate frequency at a rate greater than the Nyquist rate for the signals at the intermediate frequency, state information from at least one of the AGC, the ADC, the DSP, and the DAC providing a diagnostic output for the system, and the diagnostic output comprising at least one of fault recognition, fault reporting, performance monitoring, installation aiding, and installation verification for the system.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the full range of equivalents of the claims appended hereto.

What is claimed is:

1. A method of reporting diagnostic information regarding at least one of a plurality of subsystems of an outdoor unit receiving at least one of a plurality of wireless signals, comprising the steps of:
   receiving the at least one of the plurality of wireless signals in the outdoor unit, wherein each of the plurality of wireless signals comprises video information and is characterized by a wireless frequency band, polarization, and apparent spatial direction;
   processing the received at least one of the plurality of wireless signals by the at least one of the plurality of subsystems to generate an output signal comprising the video information of any of the plurality of wireless signals, frequency translated to one of a plurality of stacked output signal frequency bands;
   generating the diagnostic information for the at least one of the plurality of subsystems based at least in part upon the processing of the at least one of the plurality of wireless signals; and
   providing the output signal and the diagnostic information to a receiver.

2. The method of claim 1, further comprising transmitting the diagnostic information from the receiver to a source of the plurality of wireless signals.

3. The method of claim 1, wherein:
   the at least one of the plurality of subsystems is selected from a group comprising:
      a mixer, for downconverting the at least one of the plurality of wireless signals according to a reference signal from a reference oscillator;
      an automatic gain controller, communicatively coupled to the mixer;
      an analog to digital converter communicatively coupled to the automatic gain controller;
      a digital signal processor, communicatively coupled to the analog to digital converter;
      a digital to analog converter, communicatively coupled to the digital signal processor; and
   the diagnostic information is determined at least in part from a state of the at least one of the plurality of subsystems.

4. The method of claim 3, wherein:
   the at least one of the plurality of subsystems comprises the automatic gain controller;
   the processing comprises match filtering the received at least one of the plurality of wireless signals; and
   the diagnostic information is determined at least in part from the match filtered at least one wireless signal and the state of the automatic gain controller.

5. The method of claim 4, wherein:
   the at least one of the plurality of wireless signals is received from one of a plurality of transponders;
   the step of generating the diagnostic information from the processing of the at least one of the plurality of wireless signals comprises the steps of:
      determining if the match filtered at least one of the plurality of wireless signals includes a match for the one of the transponders; and
      if the match filtered at least one of the plurality of wireless signals does not include a match for the one of the transponders, indicating an absence of the at least one of the plurality of wireless signals from the one of the transponders in the diagnostic information.

6. The method of claim 5, further comprising:
   determining a cause of the absence of the at least one of the plurality of wireless signals, based at least upon the diagnostic information and other diagnostic information from another receiver.

7. The method of claim 6, wherein the determined cause comprises a weather generated event if the diagnostic information indicates an absence of the at least one wireless signal from the at least one of the transponders and the other diagnostic information indicates an absence of the at least one of the plurality of wireless signals from the at least one of the transponders in the another receiver.

8. The method of claim 5, further comprising:
   receiving a second wireless signal of the plurality of wireless signals from a second transponder of the plurality of transponders in the outdoor unit;
   processing the received second wireless signal by the at least one of the plurality of subsystems to generate an second output signal;
   wherein:
      the generated diagnostic information is further based upon the second wireless signal from the second transponder; and
      the determined cause comprises a mispointing of the outdoor unit if the generated diagnostic information further indicates an absence of the second wireless signal from the second transponder.

9. An apparatus for receiving at least one of a plurality of wireless signals and for generating an output signal therefrom, wherein each of the plurality of wireless signals comprises video information and is characterized by a wireless frequency band, polarization, and apparent spatial direction, and the output signal comprises the video information of any the plurality of wireless signals, frequency translated to one of a plurality of stacked output signal frequency bands, the apparatus comprising:
a plurality of subsystems for processing the received at least one wireless signal to generate the output signal; and
a processor, for generating diagnostic information for at least one of the plurality of subsystems based at least in part upon the processing of the received at least one wireless signal, and for providing the output signal and the diagnostic information to a receiver.

10. The apparatus of claim 9, wherein the receiver further comprises a transmitter for transmitting the diagnostic information to a source of the plurality of wireless signals.

11. The apparatus of claim 10, wherein:
the at least one of the plurality of subsystems is selected from a group comprising:
a mixer, for downconverting the at least one of the plurality of wireless signals according to a reference signal from a reference oscillator;
an automatic gain controller, communicatively coupled to the mixer;
an analog to digital converter communicatively coupled to the automatic gain controller;
a digital signal processor, communicatively coupled to the analog to digital converter;
a digital to analog converter, communicatively coupled to the digital signal processor; and
the diagnostic information is generated at least in part from a state of the at least one of the plurality of subsystems.

12. The apparatus of claim 11, wherein:
the at least one of the plurality of subsystems comprises the automatic gain controller and the digital signal processor, and wherein the digital signal processor match filters the received at least one of the plurality of wireless signals; and
the diagnostic information is determined at least in part from the match filtered received wireless signal and the state of the automatic gain controller.

13. The apparatus of claim 12, wherein:
the at least one of the plurality of wireless signals is received from one of a plurality of transponders;
the processor determines if the match filtered received at least one of the plurality of wireless signals includes a match for the one of the transponders, and indicates an absence of the at least one of the plurality of wireless signals from the one of the transponders in the diagnostic information if the match filtered received at least one of the plurality of wireless signals does not include a match for the one of the transponders.

14. The apparatus of claim 13, wherein:
the plurality of subsystems processes a received second wireless signal of the plurality of wireless signals received from a second transponder of the plurality of transponders to generate a second output signal; and
the digital signal processor match filters the second wireless signal from the second transponder; and
wherein:
the generated diagnostic information is further based upon the second wireless signal from the second transponder; and
the determined cause comprises a mispointing of the apparatus if generated diagnostic information further indicates an absence of the second wireless signal from the second transponder.

15. A method of obtaining diagnostic information regarding an outdoor unit receiving at least one of a plurality of wireless signals, comprising the steps of:
transmitting the at least one of the plurality of wireless signals to an outdoor unit, each of the plurality of wireless signals comprising video information and characterized by a wireless frequency band, polarization, and apparent spatial direction, wherein the outdoor unit comprises:
a plurality of subsystems for processing the received at least one wireless signal to generate an output signal comprising the video information of any the plurality of wireless signals, frequency translated to one of a plurality of stacked output signal frequency bands; and
a processor, for generating diagnostic information for at least one of the plurality of subsystems based at least in part upon the processing of the received at least one wireless signal, and for providing output signal and the diagnostic information to a receiver;
receiving the diagnostic information from the receiver.

16. The method of claim 15, wherein:
the at least one of the plurality of subsystems is selected from a group comprising:
a mixer, for downconverting the at least one of the plurality of wireless signals according to a reference signal from a reference oscillator;
an automatic gain controller, communicatively coupled to the mixer;
an analog to digital converter communicatively coupled to the automatic gain controller;
a digital signal processor, communicatively coupled to the analog to digital converter;
a digital to analog converter, communicatively coupled to the digital signal processor; and
the diagnostic information is determined at least in part from a state of the at least one of the plurality of subsystems.

17. The method of claim 16, wherein:
the at least one of the plurality of subsystems comprises the automatic gain controller;
the processing of the received at least one of the plurality of wireless signals comprises match filtering the received at least one wireless signal; and
the diagnostic information is determined at least in part from the match filtered at least one of the plurality of wireless signals and the state of the automatic gain controller.

18. The method of claim 17, wherein:
the at least one of the plurality of wireless signals is received from one of a plurality of transponders;
the diagnostic information is determined by:
determining if the match filtered at least one of the plurality of wireless signals includes a match for the one of the transponders;
if the match filtered at least one of the plurality of wireless signals does not include a match for the one of the transponders, indicating an absence of the at least one of the plurality of wireless signals from the one of the transponders in the diagnostic information.

19. The method of claim 18, further comprising:

determining a cause of the absence of the at least one of the plurality of wireless signals, based at least upon the diagnostic information and other diagnostic information received from another receiver.

20. The method of claim 19, wherein the determined cause comprises a weather generated event if the diagnostic information indicates an absence of the at least one of the plurality of wireless signals from the at least one of the transponders and the other diagnostic information indicates an absence of the at least one of the plurality of wireless signals from the at least one transponder in the another receiver.

\* \* \* \* \*